United States Patent [19]

Hoyt et al.

[11] Patent Number: 4,787,551
[45] Date of Patent: Nov. 29, 1988

[54] METHOD OF WELDING THERMOCOUPLES TO SILICON WAFERS FOR TEMPERATURE MONITORING IN RAPID THERMAL PROCESSING

[75] Inventors: Judy L. Hoyt, Palo Alto; Kenneth E. Williams, Los Altos; James F. Gibbons, Palo Alto, all of Calif.

[73] Assignee: Stanford University, Stanford, Calif.

[21] Appl. No.: 46,848

[22] Filed: May 4, 1987

[51] Int. Cl.⁴ ............................................. B23K 31/02
[52] U.S. Cl. ................... 228/179; 228/123; 228/208; 228/254
[58] Field of Search ............... 228/179, 123, 208, 254

[56] References Cited

U.S. PATENT DOCUMENTS

| | | | |
|---|---|---|---|
| 3,002,271 | 10/1961 | Thornton | 228/254 |
| 3,021,595 | 2/1962 | Milam | 228/123 |
| 3,202,489 | 9/1965 | Bender | 228/254 |
| 3,217,401 | 11/1965 | White | 228/123 |
| 3,665,589 | 5/1972 | Farrell | 228/208 |
| 3,821,614 | 6/1974 | Schmidt | 228/179 |
| 3,889,364 | 6/1975 | Krueger | 228/179 |
| 3,923,609 | 12/1975 | Welch | 228/123 |

FOREIGN PATENT DOCUMENTS 929421  6/1963  United Kingdom ............... 228/254

*Primary Examiner*—Kurt Rowan
*Attorney, Agent, or Firm*—Flehr, Hohbach, Test, Albritton & Herbert

[57] ABSTRACT

Disclosed is a method of welding a temperature-sensing thermocouple to a silicon wafer for sensing the temperature of the wafer during rapid thermal processing using TIG welding and/or electron-beam welding. In one embodiment, a ball of silicon is formed on the bead at one end of a thermocouple by placing the thermocouple on a silicon chip and then melting the silicon chip with a TIG welder. The ball and thermocouple are then placed on the surface of a silicon wafer and the ball and surface are then melted whereby the ball of silicon flows into the silicon wafer. In placing the thermocouple on an edge portion of a silicon wafer, the wafer is supported on a tantalum plate with the edge portion of the wafer extending beyond the plate. A molybdenum sheet is positioned on the top surface of the wafer with the edge portion of the wafer exposed. A TIG arc is established with the molybdenum layer and then the arc is moved to the edge portion of the wafer for melting the silicon. In attaching the thermocouple on the silicon wafer other than on an edge portion, electron-beam welding is employed. An electron beam at low power is focused on the ball of silicon, and then the power of the electron beam is increased while the beam is pulsed so that the ball and adjacent silicon wafer are melted.

8 Claims, 2 Drawing Sheets

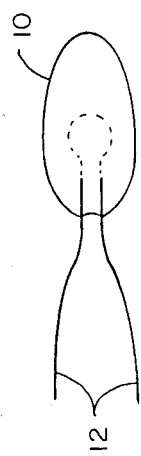
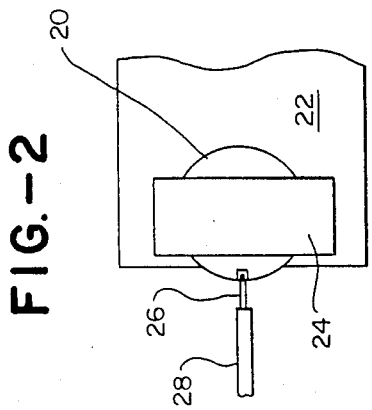
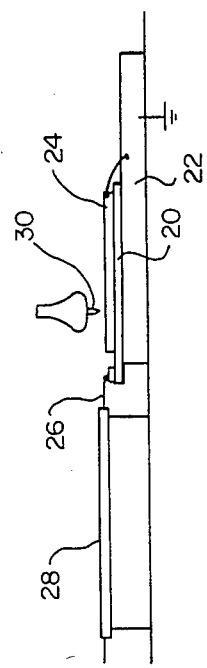
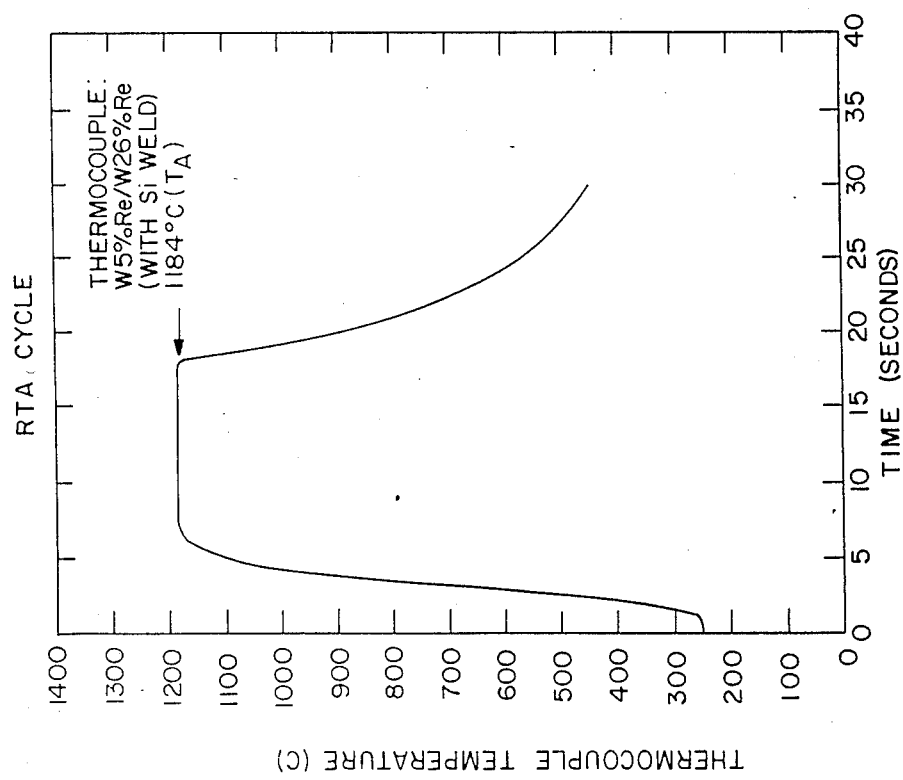

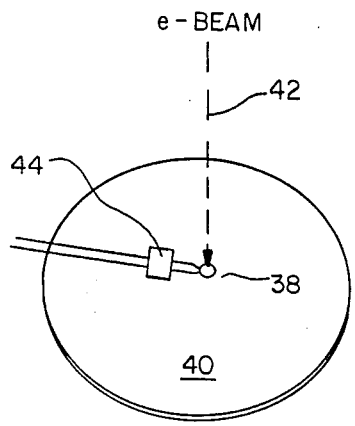
FIG.—4
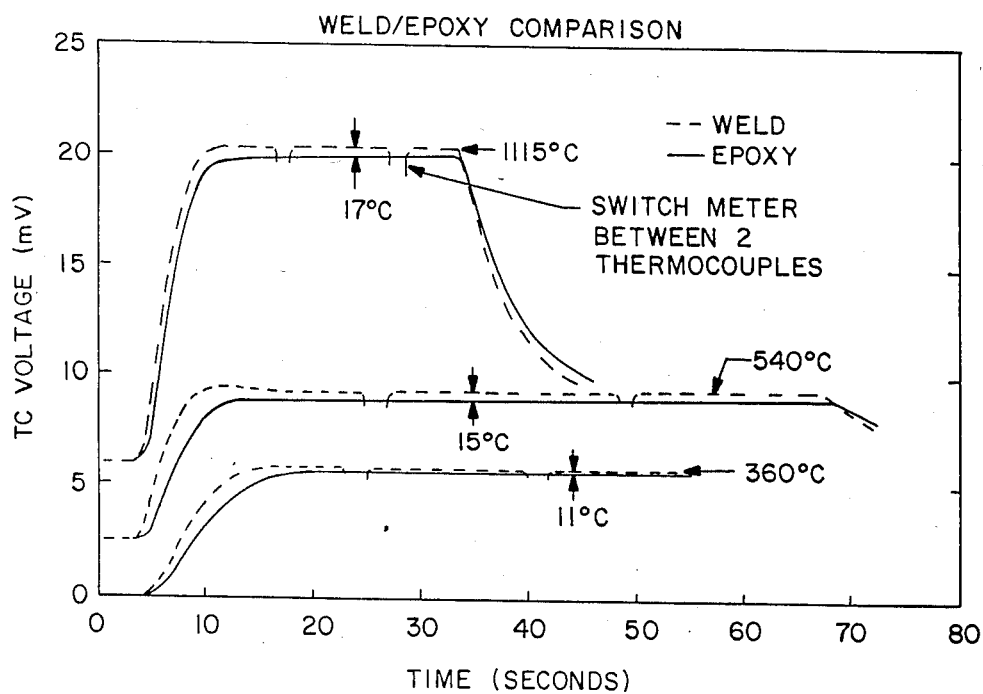
FIG.—5

METHOD OF WELDING THERMOCOUPLES TO SILICON WAFERS FOR TEMPERATURE MONITORING IN RAPID THERMAL PROCESSING

The U.S. Government has rights in the invention pursuant to DARPA Contract No. DAAG29-85-K-0237.

BACKGROUND OF THE INVENTION

This invention relates generally to temperature monitoring in rapid thermal processing (RTP) of silicon wafers, and more particularly the invention relates to the welding of temperature-sensing thermocouples to silicon wafers for temperature monitoring in rapid thermal processing.

The trend toward smaller device geometries for VLSI circuits has created interest in short-time (one to 100 seconds), high-temperature processing of silicon. Examples include rapid thermal annealing (RTA) and rapid thermal processing (RTP) of ion-implanted layers, as disclosed in U.S. Pat. No. 4,331,485 for Method of Heat-Treating Semiconductor Material Using High-Intensity CW LAMPS. Another example is limited reaction processing (LRP) which is described in U.S. Pat. No. 4,544,418 for process for High-Temperature Surface reactions in Semiconductor Material. Such techniques use radiant heating (e.g. tungsten filament, quartz envelope lamps) to couple power into the silicon.

In order to take advantage of these techniques, it is necessary to measure and control the wafer-temperature-versus-time profile very accurately. Commercial RTP systems use either thermocouples attached to the silicon or pyrometers which are calibrated against thermocouples to monitor the semiconductor processing temperature.

A persistent problem is the method used to bond thermocouples to the silicon wafers which serve as temperature sensors. Poor thermal contact and slow response times can limit accurate measurement of the wafer transient and, in some cases, steady-state temperature. Conventionally, holes are drilled into the silicon wafer for insertion of the thermocouple. The thermocouple is then sealed in the hole with a ceramic cement. This process can introduce impurities into the environment which can adversely affect both the temperature sensor and devices fabricated in the silicon wafer. Further, the desired thermal contact is not easily reproduced using cement holes. Additionally, the integrity of the thermocouple can be jeopardized.

Applicants have heretofore suggested the use of thermocouples welded directly to the silicon wafer, but the technique for welding the thermocouples has not been disclosed. See, for example, Gibbons et al. "Limited Reaction Processing: Silicon Epitaxy," *Applied Physics Letters*, 47(7) Oct. 1, 1985.

SUMMARY OF THE INVENTION

An object of the present invention is an improved temperature sensor for use in rapid thermal processing.

Another object of the invention is a method for welding a thermocouple directly to a silicon wafer.

Still another object of the invention is a method of welding thermocouples to a silicon wafer that is clean and reproducible.

Yet another object of the invention is a thermocouple bond which adds minimal thermal mass to the silicon wafer, and uses only silicon as the bonding material.

In a preferred embodiment of the invention, both tungsten inert gas (TIG) welding and electron-beam welding are employed in bonding a thermocouple to a silicon wafer. Initially, the bead at one end of the thermocouple wires is welded to a small silicon chip using TIG welding, thereby forming a small ball of silicon surrounding the thermocouple bead. Thereafter, the silicon ball is welded to a silicon wafer at any desired location through use of a scanned electron beam. Power of the electron beam is controlled whereby the thermocouple ball and the wafer surface area are heated to melting without adversely affecting the silicon wafer.

In another embodiment of the invention where the thermocouple is to be placed at the edge of a wafer, the thermocouple wires and ball are directly welded to the silicon wafer through use of TIG welding. The wafer is placed on a suitable support plate with the wafer edge extending off the support plate. A protective sheet is placed over the wafer but with the edge portion exposed. The TIG arc is established with the protective sheet and then moved to the edge portion of the silicon wafer for effecting the weld.

The invention and objects and features thereof will be more readily apparent from the following detailed description and appended claims when taken with the drawing.

BRIEF DESCRIPTION OF THE DRAWING

FIG. 1 is a plot illustrating a typical time-temperature profile during a rapid thermal anneal.

FIG. 2 is an illustration of thermocouple wires bonded to a silicon ball as employed in the present invention.

FIGS. 3A and 3B are a top view and a side view, respectively, illustrating thermocouple bonding in accordance with one embodiment of the invention.

FIG. 4 is a perspective view illustrating thermocouple bonding in accordance with another embodiment of the invention.

FIG. 5 is a graph comparing conventional cemented thermocouples with welding thermocouples in accordance with the invention.

DETAILED DESCRIPTION OF ILLUSTRATIVE EMBODIMENTS

Referring now to the drawings, FIG. 1 is a plot illustrating the time and temperature cycling of a silicon wafer during rapid thermal processing. In a typical annealing sequence, the wafer is rapidly ramped from a preheated temperature on the order of 250° C. to an annealing temperature of 1184° C. ($T_a$). The anneal temperature, $T_a$, is maintained for a time period of less than 15 seconds, and then the lamp power is either shut off or ramped to zero intensity. A key element in the rapid thermal processing system is the wafer temperature measurement apparatus which is usually a thermocouple or pyrometer. When the system is operated in a "closed loop" mode, the signal from the temperature monitor is used by microprocessor control means to adjust the lamp power to obtain the desired temperature-vs.-time cycle.

In standard semiconductor processing furnaces, thermocouples (typically Pt/Pt-Rh) calibrated under strict standards are used to monitor the thermal equilibrium furnace temperature with a very high degree of accuracy. Although such thermocouples remain the most accurate method for temperature monitoring during RTP, there are several reasons why difficulties are encountered when the thermocouples are used. First, in contrast to furnace processing, during RTP the reactor parts are not in thermal equilibrium. A wafer or other object irradiated by the lamps reaches a temperature which depends upon its thermal mass and the radiative properties of its surfaces. During RTP the wafer is thermally isolated from its surroundings, being supported at several very small points by tiny quartz pins. The spectrum of the tungsten lamps is such that the radiation is not efficiently absorbed by the quartz, so essentially only the wafer is heated. This means that accurate measurements of wafer temperature during the steady state (the flat part of the Curve in FIG. 1) require good thermal contact between the thermocouple bead and the silicon wafer.

Further, unlike the slow temperature ramps associated with furnace processing, RTP involves rapid wafer temperature changes. The temperature sensor must have a transient response which is capable of monitoring these rapid temperature changes accurately. For thermocouples, this means small wire diameters (less than 0.010") and beads, and again good thermal contact to the wafer. In order to be useful, this contact must be reproducible (from experiment to experiment), of good physical strength, able to withstand high temperatures (up to 1400° C.), and semiconductor clean.

Various methods are now being used to try to minimize the detrimental effects of cements on the RTA temperature measurement process. One technique is to etch or drill a hole in the wafer and cement the thermocouple bead into the hole. The silicon wafer has two holes drilled into it, through which the thermocouple wires pass. The thermocouple bead is then cemented to the frontside of the wafer. The cement is covered with silicon dust prior to hardening in an attempt to match the thermal properties of the silicon wafer and improve thermal conductivity. Such techniques add some structural integity and help improve thermal contact, but they are cumbersome and do not solve the problem of measurement of temperature transients. Since the composition of the cement is not well controlled, it can introduce undesirable contaminants into the processor.

In accordance with the present invention, a method of bonding thermocouples to a wafer is provided whereby no foreign material is introduced between the thermocouple bead and the silicon. The bonding material is the silicon itself, which has been locally melted and rapidly resolidified in order to embed the thermocouple wire bead into the silicon.

To facilitate the bonding of the thermocouple to the silicon wafer, a small ball of silicon is first attached to the thermocouple bead as shown in FIG. 2 where a silicon ball 10 is attached to the bead at the end of the thermocouple wires 12. This is accomplished by heating a small chip of silicon (e.g. 1.5 mm square with a thickness of 0.010") and the thermocouple wires with a TIG welder so that the silicon melts and resolidifies as a ball surrounding the thermocouple bead. It is important to minimize the heat exposure of the tungsten wires during the process, leaving the arc on just long enough to flow the silicon. The "ball" itself is usually an elongated sphere, with one flat surface left to facilitate bonding to the wafer surface. The thermocouple and silicon ball are then bonded to the silicon wafer.

FIGS. 3A and 3B are a top view and a side view, respectively, illustrating the attachment of a thermocouple to the edge of a silicon wafer in accordance with one embodiment of the invention. In this embodiment, the silicon wafer 20 is supported on a tantalum plate 22 with the tantalum plate 22 being electrically grounded. The edge portion of the wafer 20 onto which the thermocouple is to be bonded extends beyond the edge of the plate 22. A protective sheet 24 such as molybdenum is positioned over the top surface of the silicon wafer 20 with the edge portion of the wafer 20 exposed. The thermocouple wire 26 is supported in a ceramic tube 28 to electrically isolate the wire, and the end of the thermocouple 26 is brought into contact with the edge of the silicon wafer where the bond is to be effected. The silicon chip can be placed on the silicon wafer if not earlier bonded to the thermocouple wires. A TIG welder having a tungsten point 30 is then brought into contact with the protective sheet 24 for striking a weld arc. The TIG welder should be capable of very low power densities for this application (capable of welding two 0.010" stainless steel sheets on edge). A 0.040" tungsten rod is sharpened to form the tungsten point. Importantly, the sheet 24 protects the underlying silicon wafer from the arc. The arc is then moved off the sheet 24 to the edge of the wafer 20 for heating the silicon chip, the wafer edge portion and the thermocouple and effecting the weld.

The tantalum plate provides a good ground plane and molten silicon will not stick to the plate. The thermocouple wires are insulated from ground by the ceramic tubing which is necessary to prevent the arc current from shorting through the tungsten wires and destroying them.

In welding the thermocouple, the arc initiated on the protective sheet covering the silicon wafer and is moved laterally onto the weld chip. The chip will melt quickly, surrounding the thermocouple and silicon ball with silicon, and flowing into the underlying wafer to form a good bond. The arc current is removed and the silicon is rapidly cooled by the flowing argon gas. The amount of time the arc actually heats the sample is usually only several seconds.

Because the silicon wafers tend to shatter when the arc current is applied anywhere except near the edges, the TIG welding technique is limited to edge welding. To measure the temperature at an arbitrary position on the wafer, thermocouples are attached using an electron-beam welding technique in accordance with another embodiment of the invention. The electron-beam heats the region around the thermocouple more controllably and for a shorter period of time than in the TIG welding technique.

FIG. 4 is a perspective view illustrating the electron-beam welding. Again, the thermocouple and silicon ball shown generally at 38 are placed in position on the surface of the silicon wafer 40. The electronbeam 42 is focused on the thermocouple bead in a vacuum ($10^{-5}$ to $10^{-4}$ Torr) under low power. Then, the beam intensity is pulsed to high power for a very short time and scanned around the ball edge. Typical power densities are 2-3 KW/cm$^2$, for a room-temperature wafer stage. Heating the stage to 200°-400° C. will reduce the required surface power density. The silicon in the region around the thermocouple melts, thereby causing the wire bead and silicon ball to sink into the molten silicon. The silicon then resolidifies and the thermocouple is embedded in the wafer. A weight 44 can be placed on the thermocouple to hold the silicon ball 38 in good contact with wafer 40.

In both techniques, the wafer may be oxidized and/or receive a silicon nitride deposition before the welding operation. This serves as a scratch mask and is removed following the welding process. The wafers with tungsten thermocouples attached may be cleaned in a solution of sulfuric acid, water and dilute hydrogen peroxide.

Among the commonly-available thermocouples, the choice of wire material for use with the present invention is limited to alloys of tungsten and rhenium. Other thermocouples are not stable when placed in intimate contact with silicon at the welding and RTP temperatures. Although the thermoelectric power of these thermocouples is less than that of chromel-alumel (type K) thermocouples used in conventional techniques, it is sufficient for temperatures in the range of interest for silicon processing (e.g. 600°-1200° C.).

The processes have been successfully employed with "type C" thermocouples comprising 0.005 inch W 5% $R_e$–W 26% $R_e$. This wire gauge is a good compromise between the need to minimize the heat-sinking effects of the wires on the wafers and the ability to withstand the welding process along with further handling. Since the tungsten/rhenium thermocouples are sensitive to oxidation, the thermocouples should be used in vacuum or reducing ambients.

The results of a direct comparison between the performance of cement thermocouples and welded thermocouples in accordance with the invention are shown in FIG. 5. Identical thermocouples were welded and cemented to a 2-inch silicon wafer at positions less than 5 mm apart. Temperature-vs.-time scans were measured on a chart recorder and digital thermocouple meter. The excess thermal mass associated with the cement, and the lack of good thermal contact, are revealed in FIG. 5.

The temperature reading of the epoxied thermocouple lags that of the welded thermocouple during the lamp power ramp-up. The cemented thermocouple also reads lower temperature during the "flat" part of the process. Such errors will result in added dopant diffusion and poor process control during RTP. Further, the welding technique overcomes these difficulties in a relatively clean and reliable manner.

Thermocouples welded to silicon wafers in accordance with the processes of the invention have demonstrated improved reliability in manufacture and in use. While the invention has been described with reference to specific embodiments, the description is illustrative of the invention and is not to be construed as limiting the invention. For example, a sheathed (subminiature) thermocouple such as is recently available from Omega Engineering Company can be employed. Various modifications and applications may occur to those skilled in the art without departing from the true spirit and scope of the invention as defined by the appended claims.

We claim:

1. A method of welding a temperature-sensing thermocouple to a silicon wafer comprising the steps of
    supporting said wafer on a plate with said edge of said wafer extending beyond said plate,
    applying a ball of silicon to a bead at an end of said thermocouple,
    positioning said thermocouple and said ball of silicon on a surface of said wafer, and
    heating said ball of silicon and said wafer surface whereby said ball of silicon flows into said wafer surface.

2. The method as defined by claim 1 wherein said step of applying a ball of silicon to said bead of said thermocouple includes placing said bead of said thermocouple onto a silicon chip, melting said silicon chip, and cooling said melted silicon chip, thereby forming said ball of silicon.

3. The method as defined by claim 1 wherein said step of heating said ball of silicon and said silicon surface includes TIG welding of said ball of silicon and said surface of said silicon wafer near an edge of said wafer.

4. The method as defined by claim 2 wherein said step of positioning said ball of silicon on a surface includes supporting said wafer on a tantalum plate with said edge of said wafer extending beyond said plate.

5. The method as defined by claim 4 wherein said step of heating said ball of silicon and said silicon surface includes providing a sheet of molybdenum on said wafer with said edge exposed,
    striking an arc with a TIG welder on said molybdenum surface, and
    moving said arc to said silicon surface near said edge of said wafer.

6. The method as defined by claim 1 wherein said step of heating said ball of silicon and said surface includes
    placing said ball of silicon on said surface in a vacuum,
    focusing an electron beam on said ball, and
    pulsing said electron-beam to a higher power level, thereby melting said ball and the adjacent surface of said wafer.

7. A method of welding a temperature-sensing thermocouple to a silicon wafer comprising the steps of
    supporting said wafer on a tantalum plate with an edge of said wafer extending beyond said plate,
    positioning said thermocouple on said silicon wafer near said edge,
    providing a sheet of molybdenum on said wafer with said edge exposed,
    striking an arc with a TIG welder on said molybdenum surface, and
    moving said arc to said silicon wafer near said edge portion of said wafer.

8. The method as defined by claim 7 and further including placing a chip of silicon between said thermocouple and said silicon wafer.

* * * * *